United States Patent
Leu et al.

(10) Patent No.: US 7,320,935 B2
(45) Date of Patent: Jan. 22, 2008

(54) SEMICONDUCTOR DEVICE USING AN INTERCONNECT

(75) Inventors: Jihperng Leu, Portland, OR (US); Christopher D. Thomas, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/635,892

(22) Filed: Aug. 5, 2003

(65) Prior Publication Data

US 2004/0026786 A1  Feb. 12, 2004

Related U.S. Application Data

(62) Division of application No. 10/025,030, filed on Dec. 19, 2001, now Pat. No. 6,605,874.

(51) Int. Cl.
  *H01L 21/44* (2006.01)
(52) U.S. Cl. ............... 438/636; 257/734; 257/E21.584
(58) Field of Classification Search ............... 438/622, 438/627, 652–653, 656, 685, 687–688, 635–637
See application file for complete search history.

(56) References Cited

U.S. PATENT DOCUMENTS

| | | | |
|---|---|---|---|
| 5,972,786 A | 10/1999 | Hoshino | 438/627 |
| 5,994,217 A * | 11/1999 | Ng | 438/636 |
| 6,037,664 A | 3/2000 | Zhao et al. | 257/758 |
| 6,100,184 A | 8/2000 | Zhao et al. | 438/638 |
| 6,287,955 B1 | 9/2001 | Wang et al. | 438/623 |
| 6,326,305 B1 | 12/2001 | Avanzino et al. | 438/687 |
| 6,372,665 B1 | 4/2002 | Watanabe et al. | 438/780 |
| 6,380,625 B2 | 4/2002 | Pramanick et al. | 257/751 |
| 6,441,490 B1 | 8/2002 | Ngo et al. | 257/758 |
| 6,476,498 B1 | 11/2002 | Marathe | 257/775 |
| 2002/0076925 A1 | 6/2002 | Marieb et al. | 438/678 |

* cited by examiner

*Primary Examiner*—Michael Lebentritt
*Assistant Examiner*—Andre' Stevenson
(74) *Attorney, Agent, or Firm*—Schwegman, Lundberg & Woessner, P.A.

(57) ABSTRACT

The present invention includes an embodiment that relates to method of forming an interconnect. The method includes the effect of reducing electromigration in a metallization. An article achieved by the inventive method includes a first interconnect disposed above a substrate; a first conductive diffusion barrier layer disposed above and on the first interconnect; an upper interconnect, that is either landed or unlanded and that is disposed above the first interconnect; and an upper conductive diffusion barrier layer disposed above and on the upper interconnect.

17 Claims, 9 Drawing Sheets

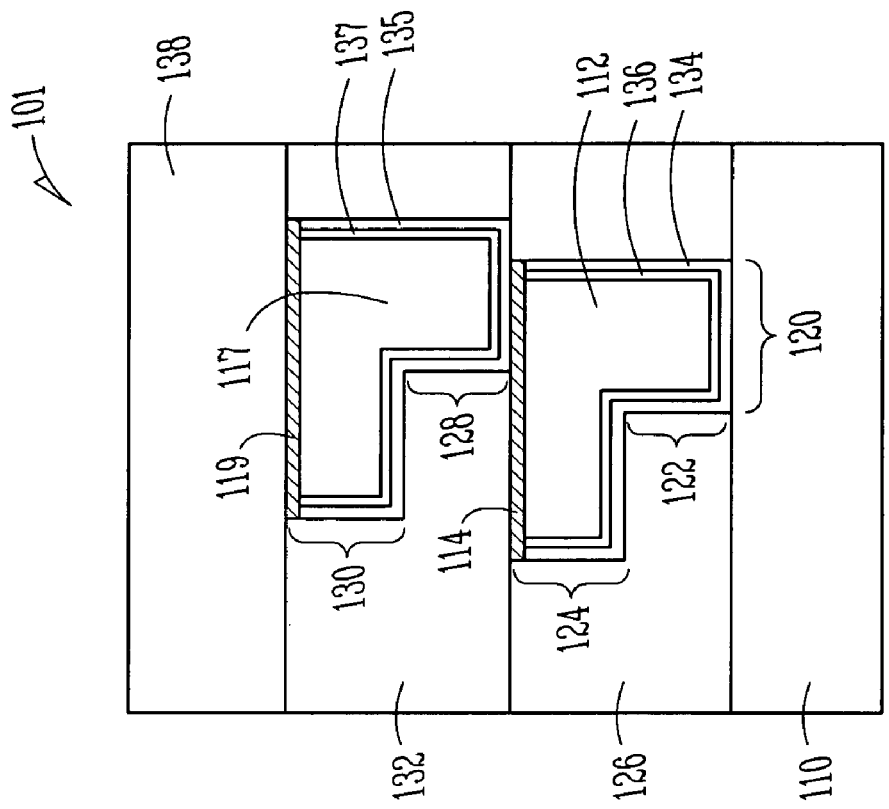
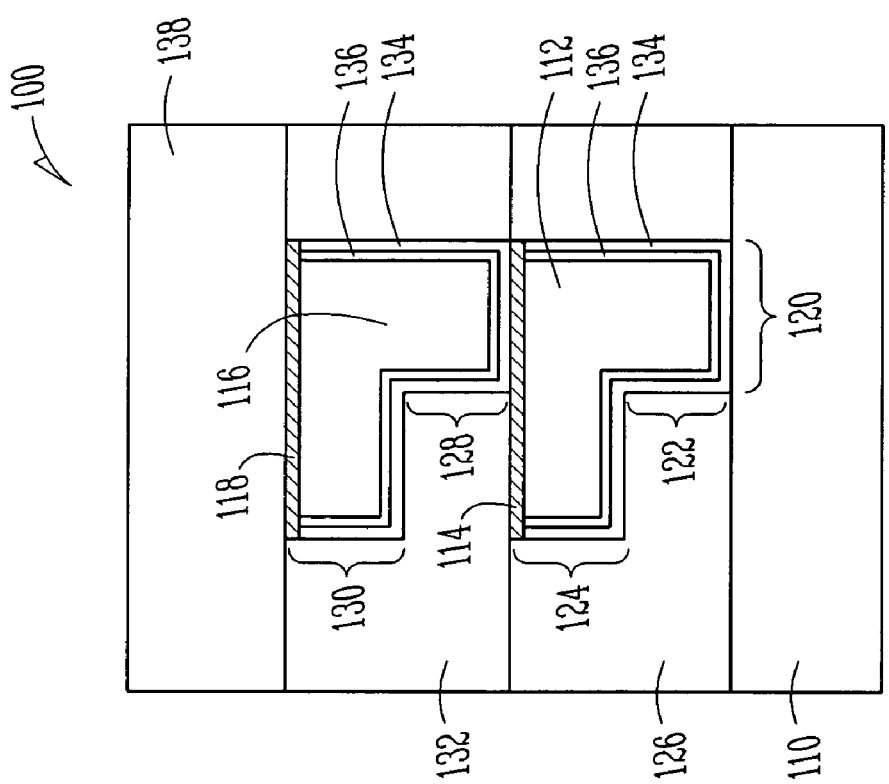

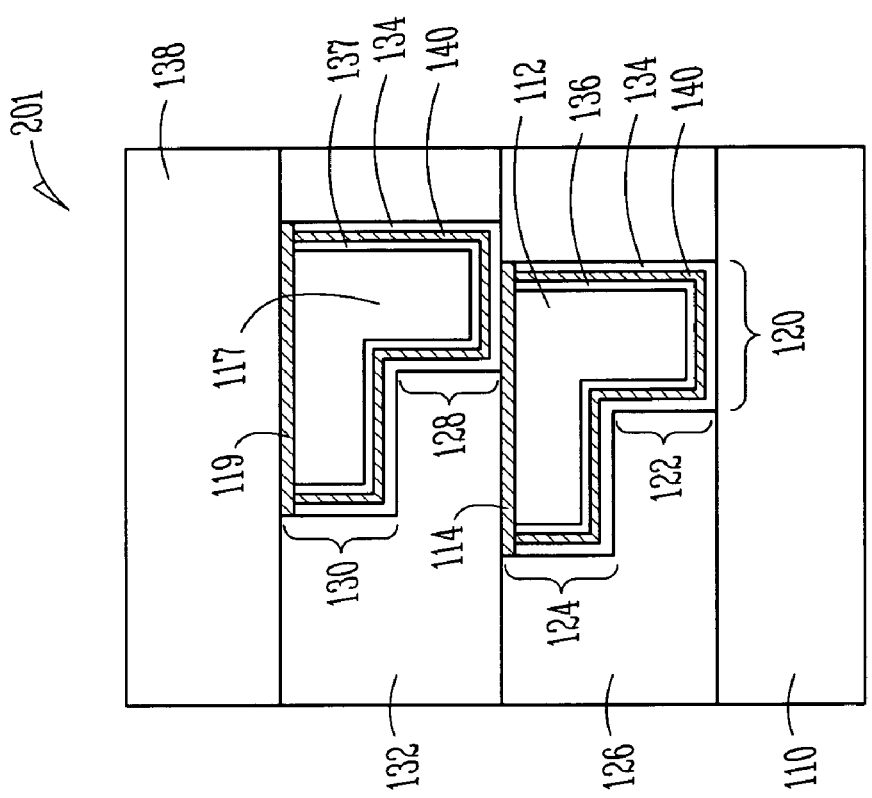
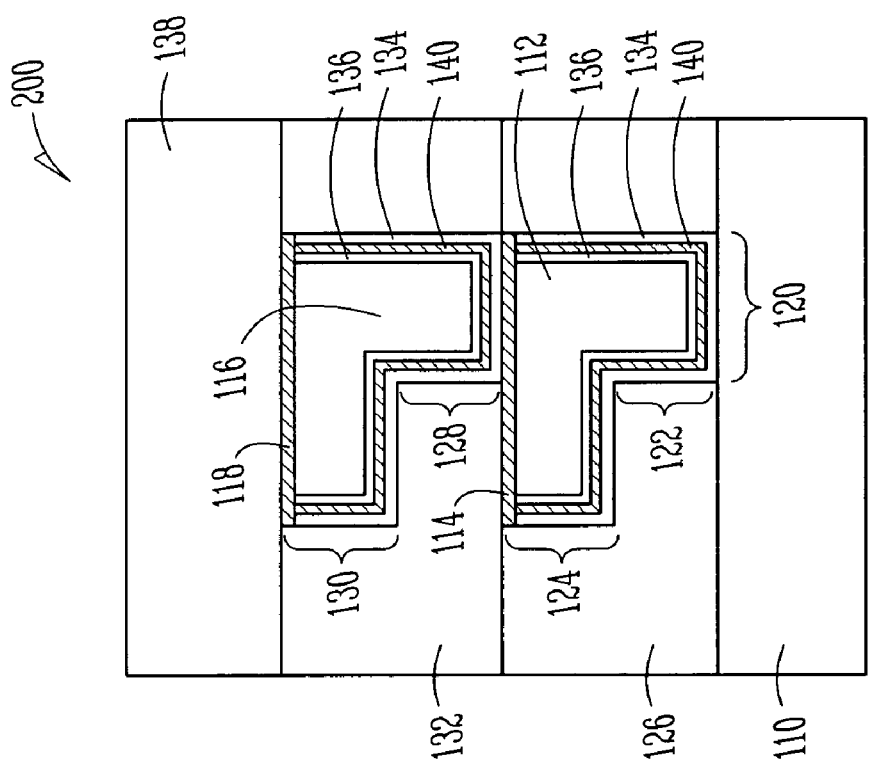
Fig. 2A
Fig. 2B

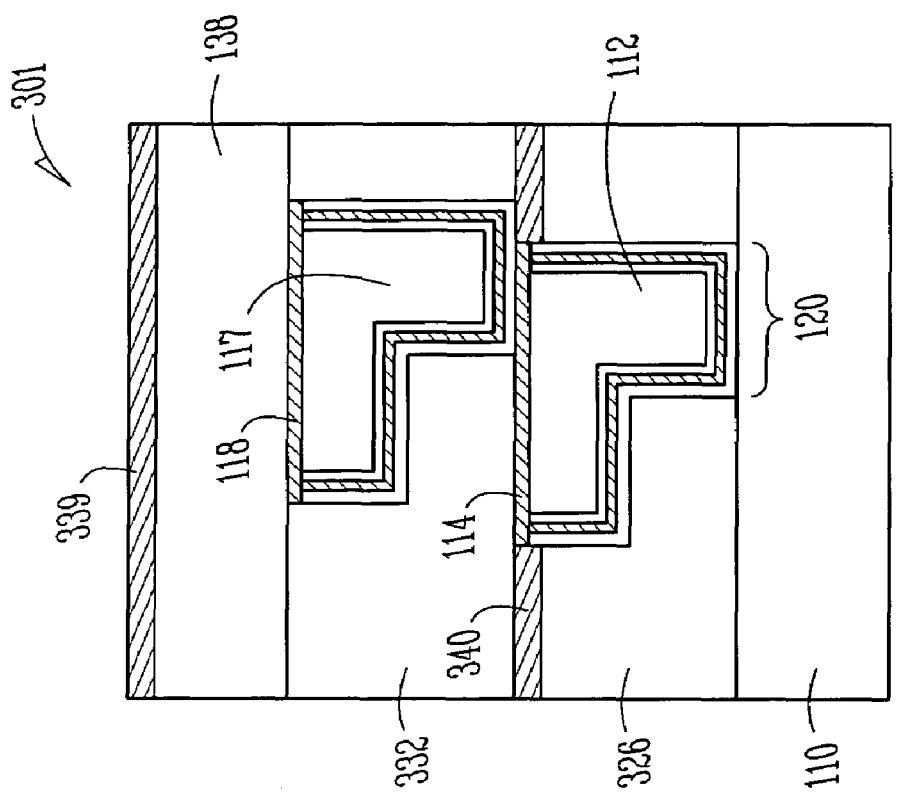
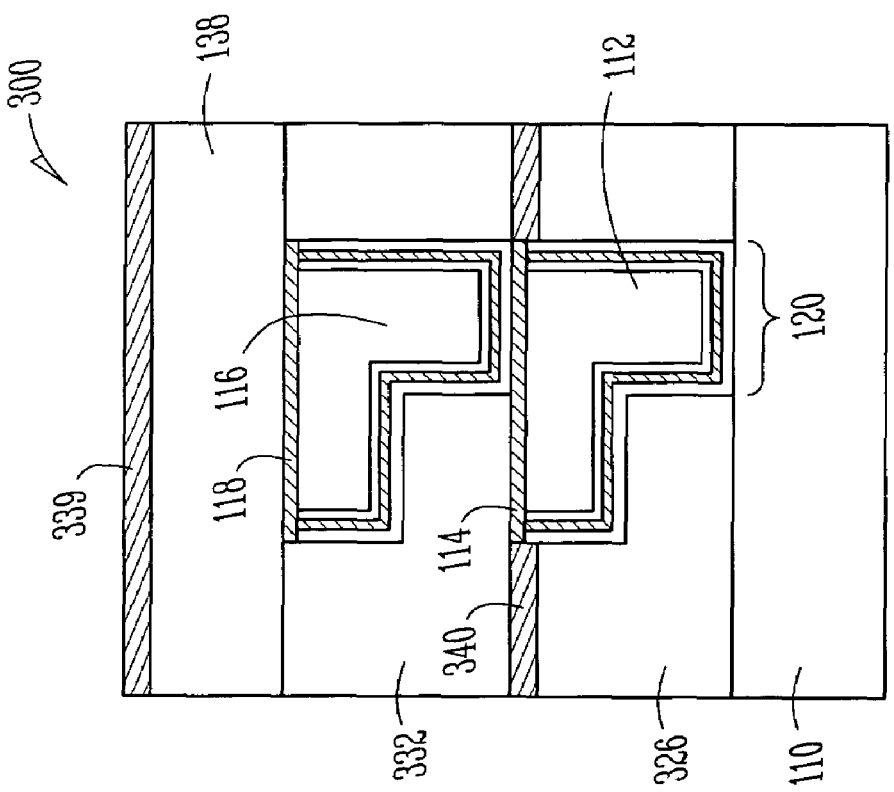

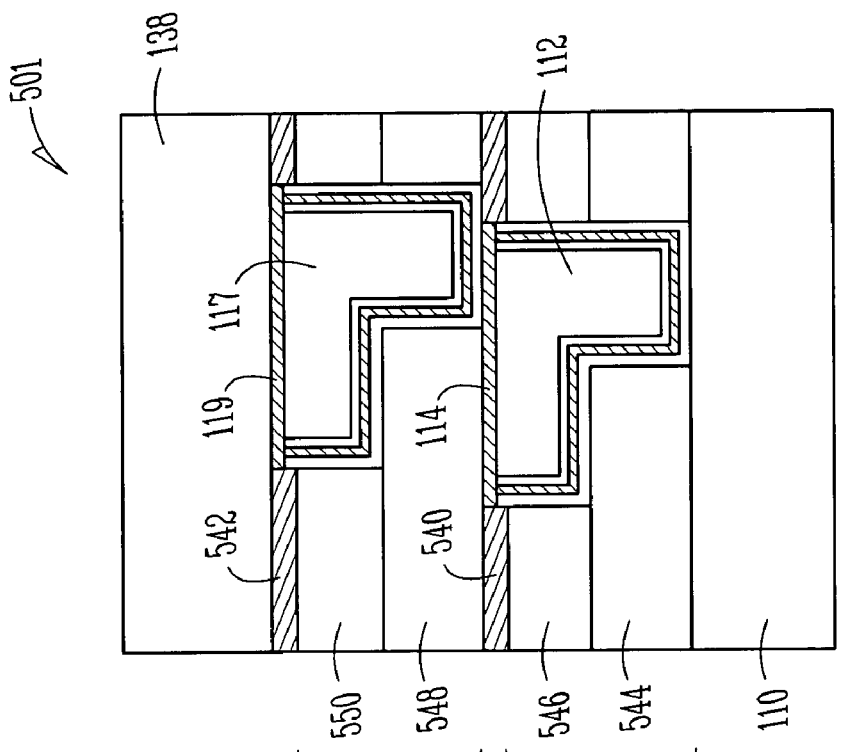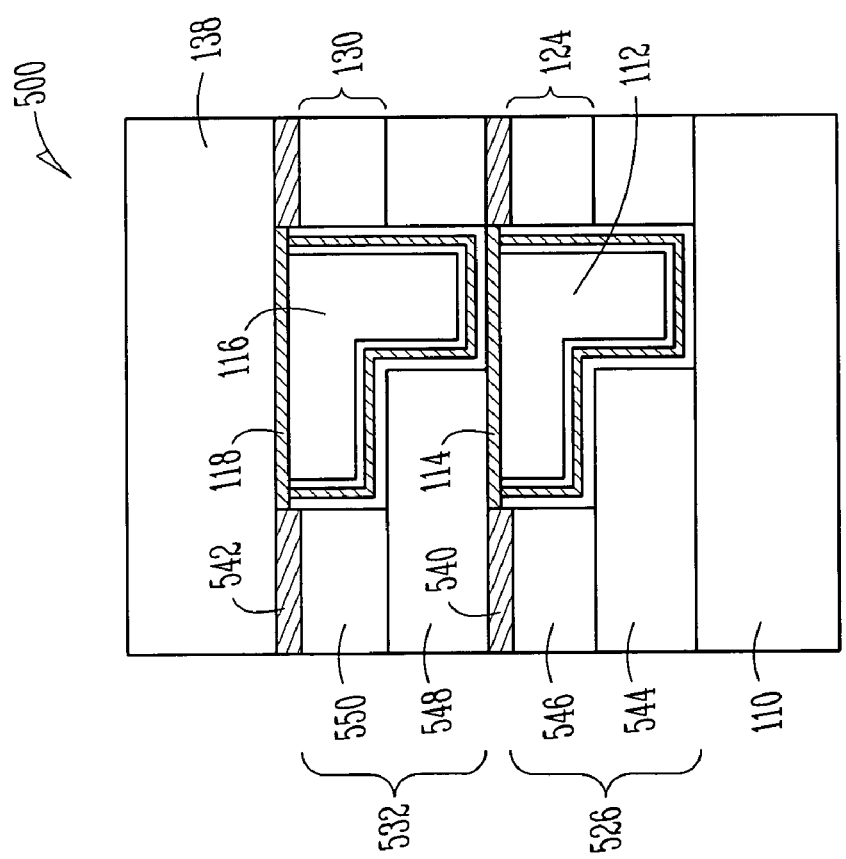

SEMICONDUCTOR DEVICE USING AN INTERCONNECT

This application is a divisional of U.S. patent application Ser. No. 10/025,030, filed Dec. 19, 2001, now issued as U.S. patent application Ser. No. 6,605,874, which is incorporated herein by reference.

BACKGROUND OF THE INVENTION

1. Field of the Invention

The present invention relates to via and trench metallization in an integrated circuit. More particularly, the present invention relates to a simplified introduction, patterning, and formation of multiple-layer interconnections in a semiconductor structure.

2. Description of the Related Art

Integrated circuits use conductive contacts and interconnects to wire together the individual devices on a semiconductor substrate, or to communicate external to the integrated circuit. Interconnect metallization for vias and trenches may include aluminum alloys and copper. A typical method of forming an interconnect is a damascene process that involves forming a via recess and an overlying trench recess in a dielectric material. The via recess and the trench recess (hereinafter referred to as "recess") is lined with a barrier layer. Where deposition assistance is required, a conductive seed material is deposited in the recess. Interconnect material is introduced into the recess, the semiconductor structure may be planarized, and a dielectric material may be formed over the interconnect.

Copper has recently been introduced as an interconnect material. But copper has technical challenges such as poor adherence to dielectrics and the resulting electromigration by the copper material during device use. Another problem for copper is poor recess fill properties that result in voids. Additionally, copper may blister or form hillocks during thermal processing.

As integrated circuits become more complex, process integration requires several processes such as forming etch stop and diffusion barrier layers in the interlayer dielectrics that surround interconnect. Additionally, because the real estate of a semiconductor device is subject to miniaturization, often multi-level interconnects are required. Typically, metallizations may be numbered, such as metal-one (M1) up to and exceeding metal-six (M6). With copper, the requirement of several layers of metallization becomes increasingly complicated by the associated requirement of etch stop and diffusion barrier structures at each level. Further, a high-density interconnect layout can require vias that do not fully land on the underlying metal layer. Unlanded vias may have significantly reduced electrical connection to the lower metallization that will result in both process yield lowering and in field failures.

BRIEF DESCRIPTION OF THE DRAWINGS

In order to illustrate the manner in which embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 1A is an elevational cross-section of a semiconductor structure that depicts a stacked-interconnect structure according to an embodiment;

FIG. 1B is an elevational cross-section of a semiconductor structure that depicts an unlanded stacked-interconnect structure according to an embodiment;

FIGS. 2A and 2B are elevational cross-sections of other semiconductor structure embodiments that depict landed and unlanded stacked-interconnect structures, respectively;

FIGS. 3A and 3B are elevational cross-sections of other semiconductor structure embodiments that depict landed and unlanded stacked-interconnect structures, respectively;

FIGS. 5A and 5B are elevational cross-sections of other semiconductor structure embodiments that depict landed and unlanded stacked-interconnect structures, respectively according to an embodiment;

DETAILED DESCRIPTION OF THE INVENTION

Figure 4B:
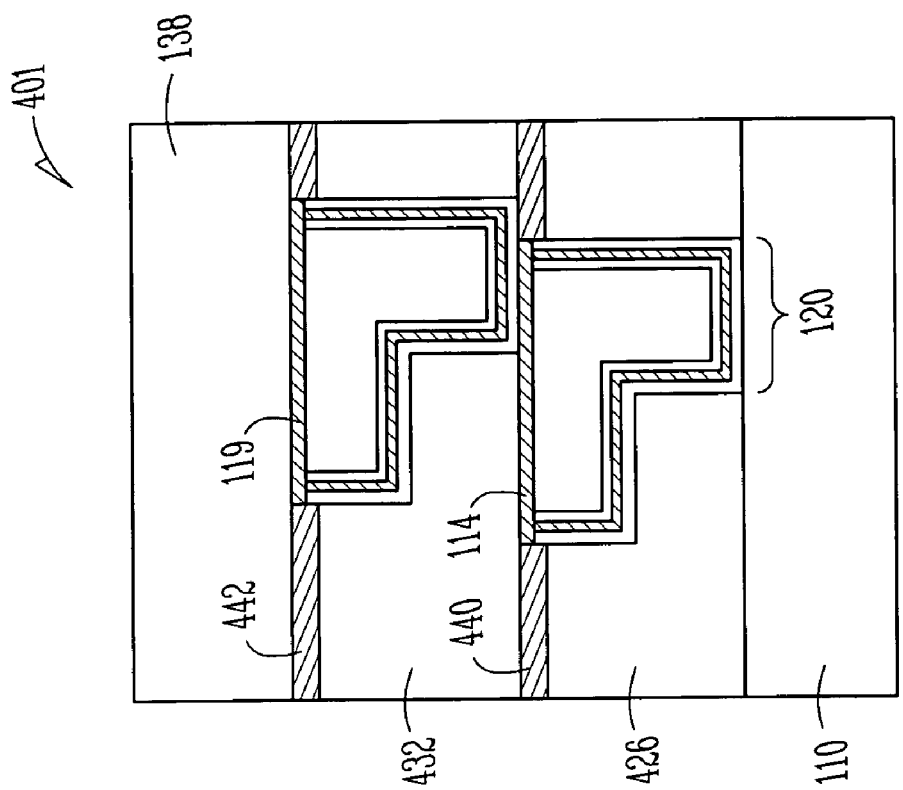
FIGS. 4A and 4B are elevational cross-sections of other semiconductor structure embodiments that depict landed and unlanded stacked-interconnect structures, respectively.

The present invention relates to a multi-level metallization structure that uses a conductive shunt. An embodiment of the present invention relates to preparing a recess to receive interconnect material. Preparation of the recess may include deposition of various films thereinto, including at least one of a diffusion barrier film, a conductive seed film, and a shunt film. Another embodiment of the present invention relates to the interconnect material that is deposited into the recess.

Another embodiment of the present invention relates to a conductive shunt layer that is deposited upon a lower interconnect at the junction between the lower interconnect and an upper interconnect. Another embodiment of the present invention relates to a conductive shunt layer that is disposed upon a lower contact at the juncture between the lower contact and an upper contact. Another embodiment of the present invention relates to various process flows that achieve the particular conductive shunt layer. Another embodiment of the present invention relates to various conductive shunt layer architectures that incorporate various interlayer dielectric (ILD) combinations.

In one embodiment, an interconnect structure is disclosed that includes a conductive shunt material. The conductive shunt material provides various article qualities for the interconnect structure. One quality is that the conductive shunt material acts as a diffusion barrier for the copper. Another quality is that the conductive shunt material acts as an etch stop during fabrication of embodiments. The conductive shunt material may, for example, contain the interconnection material that also acts to contain copper interconnection material in a recess. It may encapsulate the interconnection material, such as by lining the walls of the recess with a conductive shunt film. The conductive shunt material is selected, in one aspect, for the beneficial attributes toward improving an interconnect structure. In terms of interconnect structures comprising copper, for example, such attributes include but are not limited to, reduced electromigration, improved adhesion to dielectric material, and reduction of hillocks or blistering.

FIG. 1A is a cross-section that depicts a first embodiment of an article. A semiconductor structure 100 that has at least one active device as known in the art with a landed via is depicted with two levels of metallization, disposed above a substrate 110. FIG. 1B is a cross-section that depicts an unlanded via embodiment of a semiconductor structure 101. Except for the unlanded configuration, structures in FIGS. 1A and 1B are similar. Substrate 110 may be, for example, a conductive layer or a semiconductive layer. A microprocessor chip may have up to six or more interconnection levels that are set apart by interlayer dielectric (ILD) layers. Semiconductor structures 100 and 101 include a first interconnect 112, disposed above substrate 110, a first conductive diffusion barrier layer 114, an upper (in this instance, a second) interconnect 116 (FIG. 1A) and 117 (FIG. 1B) that is disposed above first interconnect 112. Additionally, an upper (in this instance, a second) conductive diffusion barrier layer 118 (FIG. 1A) and 119 (FIG. 1B) is disposed above and on upper interconnect 116. The upper interconnect 117 in FIG. 1B fills an unlanded contact corridor as illustrated. The conductive diffusion barrier layers 114, 118, and 119 are conductive shunt materials.

FIGS. 1A and 1B depict an interconnect zone 120 that defines a surface area for electrical connection. First interconnect 112 is disposed in a dual-damascene recess that may be formed by a two-step etch that first opens a smaller recess by an anisotropic etch, and that second opens a larger recess but that also extends the first, smaller recess to create interconnect zone 120. For example, a via and trench recess is formed by initially using a mask, such as a photoresist mask to define an area for a via opening, and by etching the via with a suitable chemistry, such as, for example, a $CH_3/CF_4$ or $C_4F_8$ etch chemistry for an SiC dielectric material. The photoresist mask may then be removed such as by an oxygen plasma to remove a photoresist, and a second mask may be patterned to define a greater area for a trench opening. A subsequent mask and etch is introduced to form a trench and the second mask is removed leaving the substrate shown in FIGS. 1A and 1B.

The dual-damascene recess includes a via 122 and a trench 124. Other etch techniques for forming a recess are set forth herein. In any event, first interconnect 112 is disposed in a first recess 122, 124 that is made in a first ILD layer 126, and upper interconnect 116 (FIG. 1A) and 117 (FIG. 1B) are disposed in an upper recess that includes a via 128 and a trench 130, and that is formed in an upper ILD layer 132. The ILD layer(s) are made of a dielectric material known in the art. For example, it may be silicon dioxide ($SiO_2$) that is formed by the decomposition of a tetraethylortho silicate (TEOS) or a plasma enhanced chemical vapor deposition (PECVD) source. The dielectric material may also be a material having a dielectric constant less than the dielectric constant of $SiO_2$ including polymers as known in the art.

In one embodiment, the recesses are lined with a film that improves adhesion of the interconnect material, and that lowers diffusion of the interconnect material. By way of non-limiting example, FIGS. 1A and 1B also show the substrate having barrier film 134 formed along the side walls and bottom of the via 122 and trench 124. In one embodiment, barrier film 134 is deposited to a thickness in a range from about 10-50 nanometers (nm). Barrier film 134 inhibits interconnect material diffusion, such as copper diffusion into first ILD layer 126. Barrier film 134 also has adhesion qualities. Examples of compositions for barrier film 134 include metals such as tantalum (Ta), tungsten (W), titanium (Ti), cobalt (Co), combinations thereof, and other refractory metals. Other examples include nitrides such as tantalum nitride (TaN), tungsten nitride (WN), titanium nitride (TiN), combinations thereof, and other refractory metal nitrides. Other examples include silicon nitrides such as tantalum silicon nitride (TaSiN), tungsten silicon nitride (WSiN), titanium silicon nitride (TiSiN), combinations thereof, and other refractory metal silicon nitrides.

Barrier film 134 may be introduced by conventional techniques, such as chemical vapor deposition (CVD). In one embodiment, barrier film 134 is introduced as a blanket over first ILD layer 126 and along the side walls and bottom of via 122 and along the side walls of trench 124. As to the upper recess, barrier film 134 is introduced as a blanket over second ILD layer 132 and along the side walls and bottom of via 128 and along the side walls of trench 130.

In another embodiment, a conductive seed film 136 is formed over the barrier film 134. Conductive seed film 136 may be provided as a preparation for plating techniques such as electroplating and electroless plating. In one embodiment, conductive seed film 136 is a copper material that is formed by CVD or physical vapor deposition (PVD) techniques. In one embodiment, conductive seed film 136 is formed to a thickness in a range from about 400 Å to about 5,000 Å. In one embodiment, conductive seed film 136 is formed to a thickness of about 3,000 Å. It is noted that a barrier film 134 and a conductive seed film 136 are also formed in the upper recess of via 128 and trench 130. After the formation of upper conductive barrier layers 118 (FIG. 1A) and 119 (FIG. 1B), another ILD layer 138 may be formed.

FIGS. 1A and 1B depict semiconductor structures 100 and 101 after filling the recesses with first interconnect 112 and interconnect 116 (FIG. 1A) and 117 (FIG. 1B). According to an embodiment, the interconnect material is selected to be an improvement over the aluminum technology. First interconnect 112 and uper interconnect 116 may be formed by electroplating. The electroplating procedd is caried out by immersing or contacting a wafer with an aqueous solution containing metal ions, such as copper sulfate-based solution, and reducing the ions onto a cathidic surface.

Various compositions are suitable according to an embodiment. Suitable copper alloys include copper-magnesium (Cu—Mg), copper-nickel (CuNi), copper-tin (CuSn), copper-indium (CuIn), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CuPd), copper-gold (CuAu), copper-platinum (CuPt), and copper-silver (CuAg). Alloys are formed by one of two methods. Typically, copper-tin, copper-indium, copper-cadmium, copper-bismuth, copper-ruthenium, copper-rhenium, copper-rhodium, and copper-tungsten are electroplated. Alternatively, copper may be doped with catalytic metals such as silver, platinum, tin, rhodium, and ruthenium.

FIGS. 1A and 1B depict semicontuctor structures 100 and 101 with a conductive shunt material that is also referred to as a conductive diffusion barrier layer. Above first interconnect 112, a first conductive diffusion barrier layer 114 is disposed, and above upper interconnect 116 (FIG. 1A) and 117 (FIG. 1b) an upper conductive diffusion barrier layer 118 and 119, respectively, is disposed. The thickness of conductive diffusion barrier layers 114, 118, and 119 are in a range from about 5 nm to about 300 nm. This shunt material facilitates adhesion between the contact material and overlying materials such as dielectric layers. Improved adhesion reduces electrical migration of the interconnect structure. The shunt material also lowers the occurrence of blistering or hillock formation of interconnect material that is brought on by thermal processing and elevated operating temperatures. The shunt material also acts as an etch stop in subsequent processing.

The first conductive diffusion barrier layer 114 and the upper conductive diffusion barrier layer 118 (FIG. 1A) and 119 (FIG. 1B) are also formed in order to contain the copper or copper-based interconnects 112, 116, and 117. Various methods for obtaining conductive barrier layer 112, 118, and 119 are used according to embodiments. For example, the conductive barrier layers 112, 118, and 119 are formed from vapor deposition processing including CVD, plasma-enhanced CVD (PECVD), atomic layer CVD (ALCVD), and PVD.

Besides vapor depositing to form the conductive diffusion barrier layers 114, 118, and 119, liquid plating processing may be done. Such liquid plating processing embodiments include spray deposition, electroplating, and electroless plating. One advantage of electroless plating of the conductive diffusion barrier layers 114, 118, and 119, is that due to the chemically-induced oxidation-reduction reaction that is carried out only at chemically enabled sites, no patterning needs to be done. According to an embodiment, semiconductor structure 100 or 101 is immersed in a bath that contains one or more metal ions, and reduction of the ions occurs at first and upper interconnects 112 and 116 (FIG. 1A) and 117 (FIG. 1*b*), respectively. The formation of first conductive diffusion barrier layer 114 is followed by the formation of the upper ILD layer 132, the dual-damascene recess formation and filling with upper interconnects 116 and 117, and finally by the formation of upper conductive diffusion barrier layers 118 and 119.

The metal ion may be selected from various metals or combinations thereof. In one embodiment, the metal is selected from at least one primary metal and from zero to at least one secondary metal. In one embodiment, the primary metal is selected from the group of copper (Cu), silver (Ag), gold (Au), and combinations thereof. In one embodiment, the at least one primary metal is selected from the group of nickel (Ni), palladium (Pd), platinum (Pt), and combinations thereof. In one embodiment, the at least one primary metal is selected from the group of cobalt (Co), rhodium (Rh), iridium (Ir), and combinations thereof. In another embodiment, the at least one primary metal is selected from a combination of at least two metals that combine metals from the above-referenced groups. In one embodiment, the primary metal(s) is supplied in a concentration range from about 2 gram/liter to about 50 gram/liter. In another embodiment, the primary metal(s) is supplied in a concentration range from about 5 gram/liter to about 35 gram/liter.

In one embodiment, at least one secondary metal is added to or used in lieu of the primary metal(s). In one embodiment, the at least one secondary metal is selected from the group of chromium (Cr), molybdenum (Mo), tungsten (W), and combinations thereof. In another embodiment, the at least one secondary metal is selected from the group of manganese (Mn), technetium (Tc), rhenium (Re), and combinations thereof. In another embodiment, the at least one secondary metal is selected from a combination of at least two metals that combine metals from the above-referenced groups. In one embodiment, the secondary metal(s) is supplied in a concentration range from about 1 gram/liter to about 40 gram/liter. In another embodiment, the secondary metal(s) is supplied in a concentration range from about 2 gram/liter to about 35 gram/liter.

Reducing agents are provided to assist in assuring metal deposition as the chemical environment of the substrate onto which the metal deposits continue to change. Although initial deposition of a primary metal onto a substrate may be autocatalytic, the changing chemical environment may interrupt the autocatalytic environment. In one embodiment, where deposition is upon a copper metal-six (Cu M6) pad as known in the art, initial deposition will be achieved in the presence of the Cu M6 pad. Consequently, the copper pad substrate affects the initial, presumably oxidation-reduction (REDOX) deposition chemistry. However, as the Cu M6 pad is covered by way of non-limiting example, by cobalt, the REDOX chemical environment changes from a cobalt-onto-copper plating, to a cobalt-onto-cobalt plating. Accordingly, a reducing agent(s) is provided to assure continued cobalt plating despite the changed substrate environment.

The initial deposition may also not be autocatalytic. This can be dealt with by (1) counter-displacement plating or a catalytic material (such as palladium, platinum, or other suitable noble metals) onto the interconnect material, or (2) the addition of a second reducing agent to the plating bath by which the mixture of the two reducing agents will allow for plating in the initial and the subsequent plating environment.

In one embodiment, the electroless plating composition is combined with from zero to at least one primary reducing agent in a mixture of solvents. In one embodiment, a primary reducing agent including boron (B) is provided. Primary reducing agents that can be utilized for this application include ammonium, alkali metal, alkaline earth metal borohydrides, and the like, and combinations thereof. In one embodiment, inorganic primary reducing agent embodiments include sodium borohydride, lithium borohydride, zinc borohydride, and the like, and combinations thereof. In one embodiment, an organic primary reducing agent is dimethylaminoborane (DMAB). In another embodiment, other aminoboranes are used such as diethylaminoborane, morpholine borane, combinations thereof, and the like. In one embodiment, the primary reducing agent(s) is supplied in a concentration range from about 1 gram/liter to about 30 gram/liter. In another embodiment, the primary reducing agent(s) is supplied in a concentration range from about 2 gram/liter to about 20 gram/liter.

In one embodiment, a secondary reducing agent is provided to assist the changing chemical environment during deposition of the primary metal and optional secondary metal. In one embodiment, a phosphorus-containing compound is selected as the secondary reducing agent. Phosphorus-containing compounds may include hypophosphites. In one embodiment, the hypophosphite is selected from organic hypophosphites such as ammonium hypophosphite and the like.

In one embodiment, the hypophosphite is selected from inorganic hypophosphites such as sodium hypophosphite and the like. One embodiment includes an inorganic phosphorus-containing compound such as hypophosphites of lithium, sodium, potassium, and mixtures thereof. One embodiment includes an inorganic phosphorus-containing compound such as hypophosphites of, magnesium, calcium, strontium, and mixtures thereof. One embodiment includes an inorganic phosphorus-containing compound such as nickel hypophosphite and the like. One embodiment includes an inorganic phosphorus-containing compound such as hypophosphorous acid and the like.

Other secondary reducing agents are selected from sulfites, bisulfites, hydrosulfites, metabisulfites, and the like. Other secondary reducing agents are selected from dithionates, and tetrathionates, and the like. Other secondary reducing agents are selected from thiosulfates, thioureas, and the like. Other secondary reducing agents are selected from hydrazines, hydroxylamines, aldehydes, glyoxylic acid, and reducing sugars. In another embodiment, the secondary reducing agent is selected from diisobutylaluminum hydride, sodium bis(2-methoxyethoxy)aluminum hydride, and the like.

In one embodiment, the secondary reducing agent(s) is supplied in a concentration range from about 0 gram/liter to about 5 gram/liter. In another embodiment, the secondary reducing agent(s) is supplied in a concentration range from about 1 gram/liter to about 2 gram/liter.

In one embodiment, the primary reducing agent is DMAB in a concentration range from about 2 gram/liter to about 30 gram/liter, and the secondary reducing agent is ammonium hypophosphite in a concentration range from about 0 gram/liter to about 2 gram/liter. Other embodiments include primary and secondary reducing agents that are substituted for DMAB and ammonium hypophosphite, or one of them, as long as they approximate the gram equivalent amounts of the primary and secondary reducing agents of the DMAB and the ammonium hypophosphite. The gram equivalent amounts may be adjusted by various means, such as according to the comparative dissociation constants of the reducing agents.

In addition to the reducing agents, other agents may be added such alkaline metal-free chelating agents. Embodiments of chelating agents include citric acid, ammonium chloride, glycine, acetic acid, malonic acid, and the like in concentration range from about 5 gram/liter to about 70 gram/liter.

A complexing agent and a buffering agent are also used to hold the metal ion(s) in solution until deposition is appropriate. In one embodiment, an organic sulphate salt compound is used such as ammonium sulphate $(NH)_2SO_4$ and the like. Other complexing and buffering agents may be selected that have an effective gram equivalent amount to the $(NH)_2SO_4$. In one embodiment, the complexing/buffering agent is supplied in a concentration range from about 50 gram/liter to about 1,000 gram/liter. In another embodiment, the complexing/buffering agent is supplied in a concentration range from about 80 gram/liter to about 600 gram/liter.

Various pH-adjusting compositions may be used including organic and inorganic bases. That a compound is basic can be easily confirmed by dipping pH test paper, measuring its aqueous solution using a pH meter, observing the discoloration caused by an indicator or measuring the adsorption of carbonic acid gas, and by other methods.

In one embodiment, the organic base compounds which can be used include organic amines such as pyridine, pyrrolidine, combinations thereof, and the like. Other embodiments include methylamine, dimethylamine, trimethylamine, combinations thereof, and the like. Other embodiments include ethylamine, diethylamine, triethylamine, combinations thereof, and the like. Other embodiments include tetramethylammonium hydroxide (TMAH), tetraethyl ammonium hydroxide (TEAH), tetrapropyl ammonium hydroxide (TPAH), tetrabutyl ammonium hydroxide (TBAH), combinations thereof, and the like. Other embodiments include aniline, toluidine, and the like.

In one embodiment, the organic base includes TMAH in a concentration range from about 30 mL to about 150 mL, added to a 100 mL volume of the other constituents of the inventive electroless plating solution. Other embodiments include the gram equivalent amounts of the organic base compounds set forth herein.

In one embodiment, the inorganic base compounds which can be used are salts of strong bases and weak acids. In one embodiment, alkali metal acetates, alkaline earth metal acetates, and combinations thereof are used. In one embodiment, alkali metal propionates, alkaline earth metal propionates, and combinations thereof are used. In one embodiment, alkali metal carbonates, alkaline earth metal carbonates, and combinations thereof are used. In one embodiment, alkali metal hydroxides, alkaline earth metal hydroxides, and combinations thereof are used. In one embodiment, combinations of at least two of the acetates, propionates, carbonates, and hydroxides is used.

Inorganic base compounds may be provided in a concentration such as a 25% NaOH in DI water solution, to make a volume of about 10 mL to about 50 mL. This volume of solution is added to an about 100 mL volume of the other inventive electroless plating composition constituents. Other embodiments include the gram equivalent amounts of the inorganic base compounds set forth herein.

Other compounds may be added to the inventive electroless plating composition such as surface active agents. One commercial surfactant is RHODAFAC RE 610, made by Aventis (formerly Rhone-Poulenc Hoechst). Another commercial surfactant is Triton x-100™ made by Sigma-Aldrich. Other surfactants include cystine, polyethylene glycols, polypropylene glycol (PPG)/polyethylene glycol (PEG) (in a molecular range of approximately 200 to 10,000) in a concentration range of about 0.01 to 5 gram/liter, and the like.

Several combinations of primary and secondary metals are achievable according to various embodiments. The primary metal may include, but is not limited to from one to nine metals, selected from copper, silver, gold, nickel, palladium, platinum, cobalt, rhodium, and iridium. The secondary metal may include, but is not limited to from zero to six metals selected from chromium, molybdenum, tungsten, manganese, technetium, and rhenium. In one embodiment, because of the presence of the primary and optional secondary reducing agents, a metallic compound forms that incorporates boron and optionally phosphorus.

In one embodiment, nickel is a primary metal for an electroless plating embodiment, the composition includes a nickel solution to form a nickel plating layer. According to an embodiment, where nickel is the primary metal, because of the inventive electroless plating bath environment, metallic films form that include but are not limited by such combinations as NiB, NiBP, NiCrB, NiCrBP, NiMoB, NiMoBP, NiWB, NiWBP, NiMnB, NiMnBP, NiTcB, NiTcBP, NiReB, and NiReBP. Where two primary metals are used in solution, the inventive electroless plating bath environment may form metallic films that include but not are limited by such combinations as to NiCoB, NiCoBP, NiCoCrB, NiCoCrBP, NiCoMoB, NiCoMoBP, NiCoWB, NiCoWBP, NiCoMnB, NiCoMnBP, NiCoTcB, NiCoTcBP, NiCoReB, and NiCoReBP. It can be seen that at least two-to nine primary metals and from zero to at least one secondary metals are combinable according to various embodiments. In similar embodiments, palladium can be used in place of- or in addition to nickel. Similarly, platinum can be used in place of- or in addition to nickel. Additionally, a blend of at least two of nickel, palladium, and platinum can be used as set forth herein.

In another embodiment, cobalt is a primary metal for an electroless plating embodiment, the composition includes a cobalt solution to form a cobalt plating layer. According to an embodiment, where cobalt is the primary metal, because of the inventive electroless plating bath environment, metallic films form that include but are not limited by such combinations as CoB, CoBP, CoCrB, CoCrBP, CoMoB, CoMoBP, CoWB, CoWBP, CoMnB, CoMnBP, CoTcB, CoTcBP, CoReB, and CoReBP. Where two primary metals are used in solution, the inventive electroless plating bath environment may form metallic films that include but are not limited by such combinations as to NiCoB, CoPdBP, CoPdCrB, CoPdCrBP, CoPdMoB, CoPdMoBP, CoPdWB, CoPdWBP, CoPdMnB, CoPdMnBP, CoPdTcB, CoPdTcBP, CoPdReB, and CoPdReBP.

It can be seen that at least two- to nine primary metals and from zero to at least one secondary metals are combinable according to various embodiments. In similar embodiments, rhodium can be used in place of- or in addition to cobalt. Similarly, iridium can be used in place of- or in addition to cobalt. Additionally, a blend of at least two of cobalt, rhodium, and iridium can be used as set forth herein.

Where, by way of non-limiting example, copper is a primary metal for an electroless plating embodiment. The composition includes a copper solution to form a copper plating layer. According to an embodiment, where copper is the primary metal, because of the inventive electroless plating bath environment, metallic films form that include but are not limited by such combinations as CuB, CuBP, CuCrB, CuCrBP, CuMoB, CuMoBP, CuWB, CuWBP, CuMnB, CuMnBP, CuTcB, CuTcBP, CuReB, and CuReBP. Where two primary metals are used in solution, the inventive electroless plating bath environment may form metallic films that include but are not limited by such combinations as to CuNiB, CuNiBP, CuNiCrB, CuNiCrBP, CuNiMoB, CuNiMoBP, CuNiWB, CuNiWBP, CuNiMnLB, CuNiMniBP, CuNiTcB, CuNiTcBP, CuNiReB, and CuNiReBP. It can be seen that at least two- to nine primary metals and from zero to at least one secondary metal is combinable according to various embodiments. In similar embodiments, silver can be used in place of- or in addition to copper. Similarly, gold can be used in place of- or in addition to copper. Additionally, a blend of at least two of copper, silver, and gold can be used as set forth herein.

Referring again to FIGS. 1A and 1B, the metal of first interconnect 112 and upper interconnects 116 and 117 may be treated to improve the uniformity of the electroless plating of the conductive diffusion barrier materials. Surface treating is done with a treatment compound such as a mineral acid. For example, a 1 to 20 volume percent hydrofluoric acid (HF) may be used. Other solutions include, sulfuric acid ($H_2SO_4$), sulfonic acids such as methanesulfonic acid (MSA), ethanesulfonic acid (ESA), propanesulfonic acid (PSA), benzene sulfonic acid (BSA), and the like.

Prior to the electroless plating process, the interconnect material may be doped. In the case of doping of copper interconnection material with, for example, palladium, the doping may be accomplished by introducing a palladium activation solution. Suitable activation solutions include palladium chloride (0.01 to 2 g/l) and hydrochloric acid (0.01 to 30 milliliters per liter (ml/l)), acetic acid (100-600 ml/l), hydrofluoric acid or ammonium fluoride (1 to 70 g/l). If doping of copper lines with gold (Au), platinum (Pt), silver (Ag), tin (Sn), rhodium (Rh), and/or ruthenium (Ru) is required, such metals can be introduced to the copper interconnect material by contact displacement from solutions containing the metal salts and acids such as hydrochloric acid, hydrofluoric acid, sulfuric acid, and nitric acid.

A top ILD layer 138 is depicted in FIGS. 1A and 1B according to an embodiment. In other embodiments (depicted in FIGS. 3A and 3B and 6A and 6B) a top hard mask 339 and 639, respectively, is included.

FIGS. 2A and 2B depict another embodiment, wherein encapsulation of the interconnect material is achieved with the conductive diffusion barrier material. The structures in FIGS. 2A and 2B are similar to the structures depicted in FIGS. 1A and 1B, with the addition of a conductive diffusion barrier film 140 that is sandwiched between the barrier film 134. It is also noted that the conductive seed film 136 is present in the case of the first interconnect 112 and landed upper contact 116 encapsulation, and the barrier film 135 and the conductive seed film 137 are present in the case of the unlanded upper interconnect 117 encapsulation. Suitable materials for the conductive diffusion barrier film and the conductive diffusion barrier layer are similar to those described herein.

After the conductive diffusion barrier film 140 is formed, the semiconductor structures 200 and 201 may be annealed to improve the adhesion thereof to the barrier film 134. In one embodiment, a thermal anneal is done in a reducing ambient such as nitrogen and hydrogen, hydrogen alone, or argon and hydrogen. Alternatively the anneal is done in a micro atmosphere or in a vacuum.

In this embodiment, a conductive seed film 136 (FIG. 2A) and 137 (FIG. 2B) is deposited after the optional anneal process. The conductive seed film 136 and 137 is formed as set forth herein. A suitable seed material for a copper interconnect material is a copper-based metal or alloy. In one embodiment, a copper-based seed material is deposited by electroless plating. In one embodiment, a conductive seed film is formed by contacting the structure with a bath containing copper ion of about 1-5 gram/liter, EDTA of about 10-60 gram/liter, glyoxylic acid as a reducing agent at about 2-20 gram/liter, and pH adjusters such as TMAH and ammonium hydroxide and a surfactant such as PEG.

After the plating of the conductive seed film, the structure may again be annealed to improve adhesion. In one example, the anneal is performed in a reducing ambient such as a nitrogen/hydrogen mixture, hydrogen alone, or an argon/hydrogen mixture. Additionally a micro atmosphere may be used or a vacuum environment may be used.

As depicted in FIGS. 2A and 2B, the first interconnect 112 and the upper interconnect 116 (FIG. 2A) and 117 (FIG. 2B) are encapsulated. An encapsulated interconnect provides a better mechanical frame and improves the electromigration performance. The encapsulated interconnect also provides an additional barrier that resists diffusion of the contact material. In the case of copper interconnect material, electromigration performance is limited by surface diffusion along copper interconnect lines. By encapsulating the interconnect material with the conductive diffusion barrier film and layer, the surface diffusion is limited.

Another feature of an embodiment is the etch stop qualities of conductive diffusion barrier layers 114, 118, and 119. The following discussion (encompassing FIGS. 3A-6B) includes the encapsulation embodiment as set forth herein. It is understood, however, that the various configurations that follow, as well as the embodiments depicted in FIGS. 1A-1B, may or may not include the encapsulation embodiment, as well as the barrier and conductive seed film embodiments, either separately or together. Further, it is understood that one embodiment includes no barrier and/or conductive seed films being placed into the recesses before the interconnect materials.

FIGS. 3A and 3B illustrate another embodiment in which disparate types of ILD layers are combined. In FIGS. 3A and 3B, first ILD layer 326 is an organic material such as a polyimide layer that is formed by spin-on and cure techniques. Other organic types include SiLK® and the like. Other organic types include FLARE® and the like made by Allied Signal of Morristown, N.J. Surmounting first ILD layer 326 is a first hard mask 340 that is typically a nitride material such as silicon nitride, titanium nitride, tungsten nitride, and the like. Above first hard mask 340 is an inorganic ILD layer (referred to hereinafter as upper ILD layer) 342. It is notable that no upper hard mask is present. First hard mask 340 acts to protect the organic first ILD layer 326 from subsequent processing. The additional ILD layer 138 in this embodiment, is also an organic material and an additional hard mask 339 is provided.

Figure 4A:
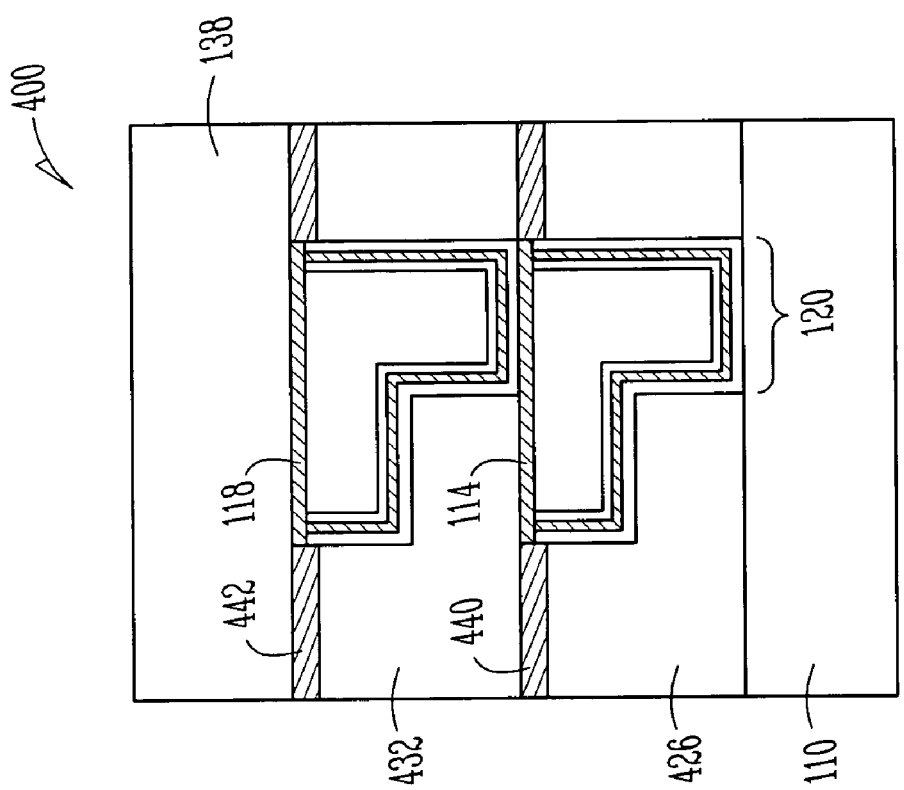

FIGS. 4A and 4B illustrate another embodiment in which a two-organic ILD layer architecture is made. First ILD layer 426 and upper ILD layer 432 are respectively surmounted by a first hard mask 440 and a second hard mask 442.

In another embodiment, several ILD layers are formed, and a dual-damascene structure results that includes organic-inorganic interfaces. FIGS. 5A and 5B illustrate another embodiment in which a four-tier ILD layer architecture is made for a two-level interconnect structure. A first ILD layer 526 and upper ILD layer 532 are respectively surmounted by a first hard mask 540 and a second hard mask 542. First ILD layer 526 includes a recess into which first interconnect 112 is disposed. First ILD layer 526 includes an inorganic first bottom ILD layer 544 and an organic first top ILD layer 546. Upper interconnect 116 (FIG. 5A) or 117 (FIG. 5B) is likewise disposed in a dual-damascene upper recess that is formed in an inorganic upper bottom ILD layer 548 and an organic upper top ILD layer 550. It is noted that first hard mask 540 is disposed over the first top ILD layer 546, and first hard mask 540 includes an opening that defines a characteristic dimension (the width of first interconnect 112 as measured from side-to-side) of first interconnect 112 at its trench level 124. Upper hard mask 542 is disposed over the upper top ILD layer 550 and similarly includes an opening that defines a characteristic dimension of upper interconnect 116 (FIG. 5A) or 117 (FIG. 5B) at its trench level 130.

Figure 6A:
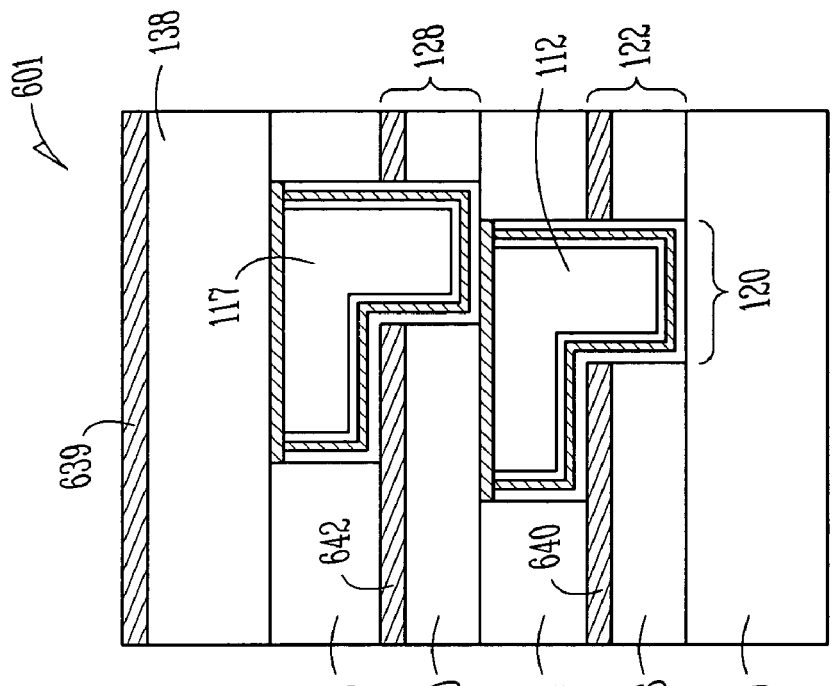
FIGS. 6A and 6B are elevational cross-sections of other semiconductor structure embodiments that depict landed and unlanded stacked-interconnect structures, respectively.
Figure 6B:
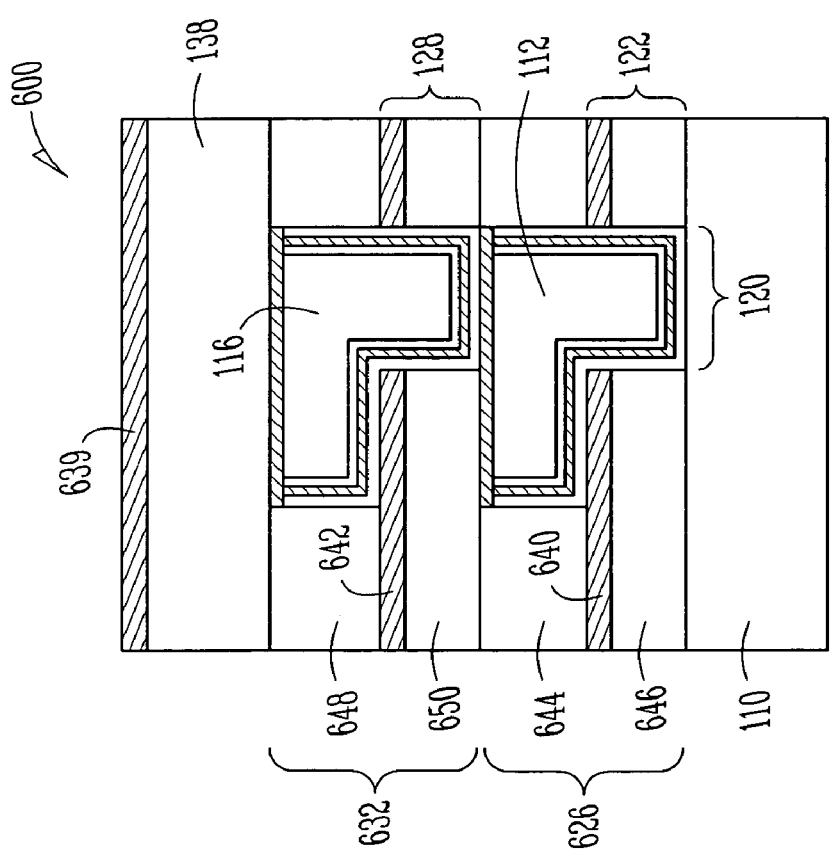

In another embodiment several ILD layers are formed, and a dual-damascene structure results that also includes organic-inorganic interfaces. FIGS. 6A and 6B illustrate one embodiment in which a four-tier ILD layer architecture is made in a two-level interconnect structure. First interconnect 112 is disposed in a dual-damascene first recess that is formed in a first ILD layer 626 including an organic first bottom ILD layer 646 and an inorganic first top ILD layer 644. Upper interconnect 116 (FIG. 6A) and 117 (FIG. 6B) is also disposed in a dual-damascene upper recess that is formed in an upper ILD layer 632 including an organic upper bottom ILD layer 650 and an inorganic upper top ILD layer 648. It is further noted that a first hard mask 640 is disposed over the first bottom ILD layer 646. First hard mask 640 includes an opening that defines a characteristic dimension (the width of interconnect zone 120) of the first interconnect 112 that includes the via 122. It is further noted that an upper hard mask 642 is disposed over the upper bottom ILD layer 650, and the upper hard mask 642 includes an opening that similarly defines a characteristic dimension (not pictured) of the upper interconnect 116 (FIG. 5A) or 117 (FIG. 5B) that includes the via 128.

By these four-tier embodiments, it should become clear to one of ordinary skill in the art that various four-tier, two-level interconnect combinations may be achieved wherein inorganic and organic ILD layers are combined. These combinations include those set forth in FIGS. 5A-6B, and additionally include an all-inorganic combination, an all-organic combination, a 3-organic, 1-inorganic combination, and a 1-organic, 3-inorganic combination. Additionally, a combination of a single-layer ILD layer at the first or upper level, may be combined with a double-layer ILD layer. Similarly, where the single-layer ILD layer is organic, the double-layer ILD layer may be above or below it, and the double-layer ILD layer may both be organic, both be inorganic, or a combination thereof. Finally, where the single-layer ILD layer is inorganic, the double-layer ILD layer may be above or below it, and the double-layer ILD layer may both be organic, both be inorganic, or a combination thereof. Additionally, it is noted that the various hard masks may be optionally omitted. These hard masks are set forth in FIGS. 3-6. For example in FIGS. 6A and 6B, the hard masks 640 and 642 may be omitted.

Figure 7:
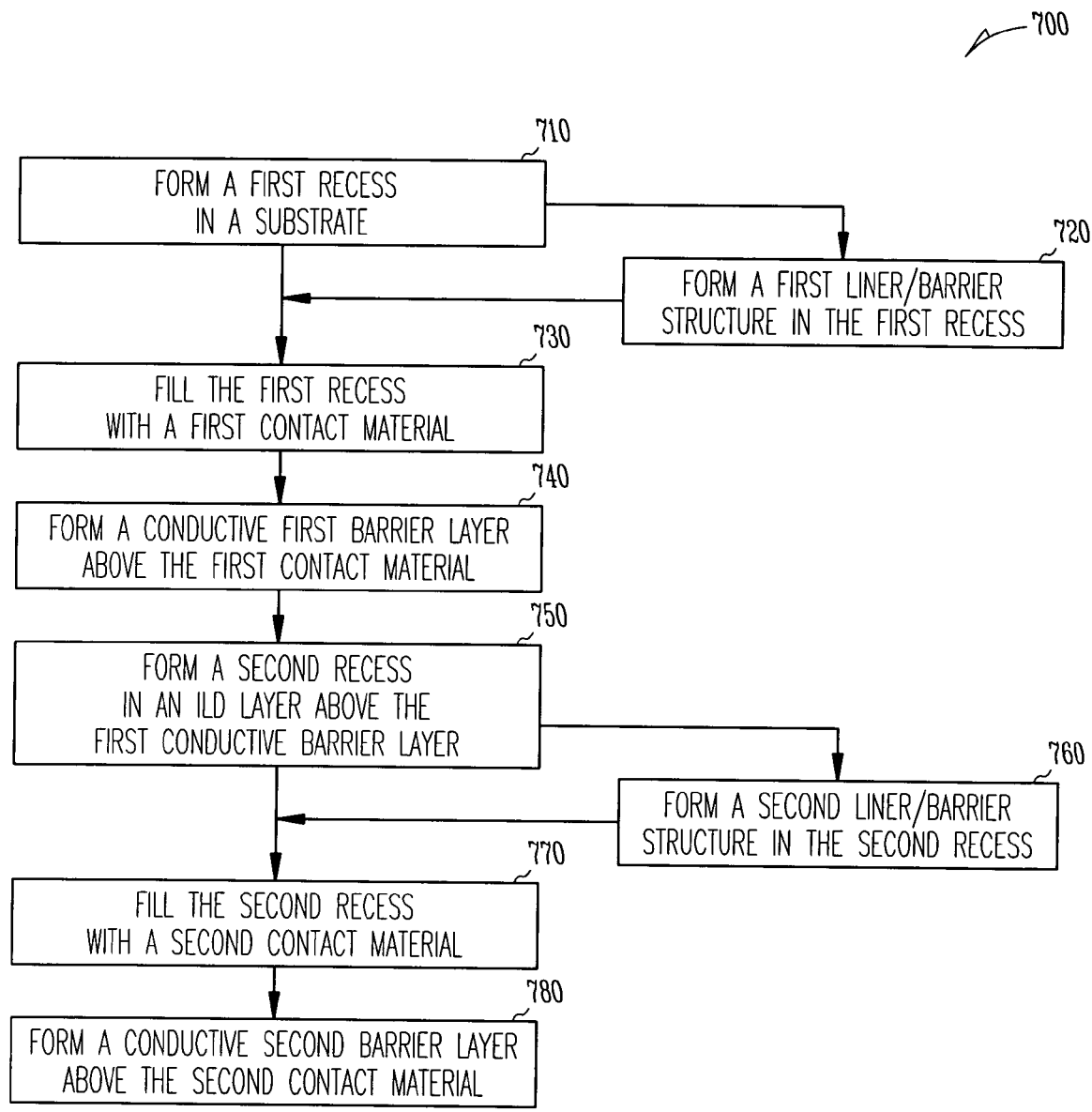
FIG. 7 is a process flow depiction according to an embodiment.

In another embodiment, a process flow is illustrated in FIG. 7. The process 700 begins by forming 710 a first recess in a substrate. A non-limiting example of this process is the formation of first recess 122 and 124 as depicted in either FIGS. 1A and 1B or in FIGS. 5A and 5B. Next, an optional liner/barrier structure is formed 720 in the first recess. An embodiment of this process flow is the barrier film 134 and conductive seed film 136 in the first recess as set forth herein. Another embodiment of this process flow is the barrier film 134, conductive diffusion barrier film 138, and conductive seed film 136 in the first recess as set forth herein. It is also notable in the case of unlanded via embodiments that etching may cause an off-centered recess to form. In one embodiment, the formation of the films as set forth herein, allows for significant off-centered recess filling.

After the optional film formation, the first recess is filled 730 with a first interconnect material. Following the formation of a first interconnect material, a conductive first diffusion barrier layer is formed 740 according an embodiment as set forth herein. In one exemplary process flow, the conductive first diffusion barrier layer is formed by electroless plating. Thereafter, a second or upper ILD layer is formed and a second or upper recess is formed 750 in the second or upper ILD layer. Alternatively as set forth herein, formation 760 of one of the barrier film etc. embodiments may be followed in the process flow for the second or upper recess. Similarly, the second or upper recess is next filled 770 with a second or upper interconnect material. Finally, according to this part of the process flow, a conductive second or upper diffusion barrier layer is formed 780.

It can now be appreciated that where "upper" is used in this disclosure, it may mean a third architecture, a fourth, a fifth, a sixth, etc. according to the various levels of metallization according known metallization architectures. Additionally, where a "first" architecture is depicted, it may be an architecture that has other architectures disposed below it. For example referring to FIG. 1A, first interconnect 112 may be a metal-five (M5) interconnect, and upper interconnect may be an M6 interconnect.

Figure 8:
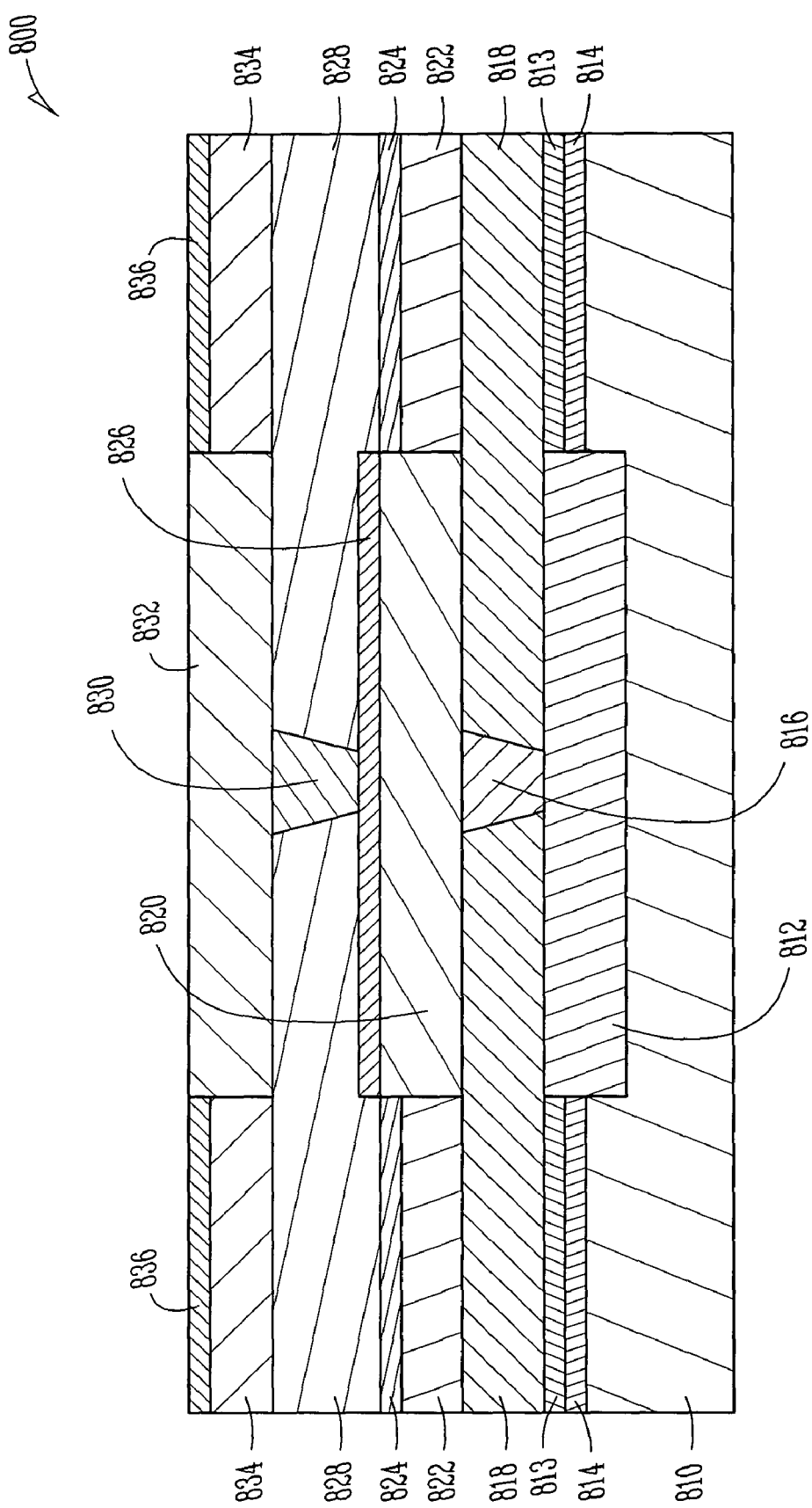
FIG. 8 is an elevational cross-section drawing of a photomicrograph according to an embodiment.

FIG. 8 is a cross-section drawing of a photomicrograph of a semiconductor structure 800 according to an embodiment. The semiconductor structure 800 was fabricated according to an embodiment and the resulting structure represents one exemplary embodiment. The substrate 810 is an organic ILD material such as SiLK® made by Dow Chemical of Midland, Mich. A bottom metallization 812 that is a copper trace, is disposed in substrate 810. A bottom hard mask 814, made of a nitride material as set forth herein is disposed above substrate 810 along with a bottom etch stop layer 813. Bottom hard mask 814 makes an opening that defines a characteristic dimension (the left-to-right width) of bottom metallization 812. A first lower ILD layer 818 made of SiLK® is disposed over bottom metallization 812 and bottom hard mask 814. In a recess, a first interconnect 816 makes an electrical connection between bottom metallization 812 and a first metallization 820. First metallization 820 is disposed in a first upper ILD layer 822 made of SiLK®. A first hard mask 824, made of a nitride material is disposed over first upper ILD layer 822, and has an opening that defines a characteristic dimension of first metallization 820. Disposed above first metallization 820 is a first conductive diffusion barrier layer 826 that is made of cobalt-phosphorus according to an electroless plating embodiment.

In the photomicrograph drawing depicted in FIG. 8, an upper or second metallization 832 is also formed. A second lower ILD layer 828 made of SiLK® is disposed over first conductive diffusion barrier layer 826 and first hard mask 824. Second lower ILD layer 828 defines a recess that is filled with a second or upper interconnect 830. Second interconnect 830 makes an electrical connection between first metallization 820 and a second metallization 832 through the shunt layer that is first conductive diffusion barrier layer 826. Second metallization 832 is disposed in a second upper ILD layer 834 made of SiLK®. A second or upper hard mask 836, made of a nitride material is disposed over second upper ILD layer 834, and has an opening that defines a characteristic dimension of second metallization 832.

Figure 9:
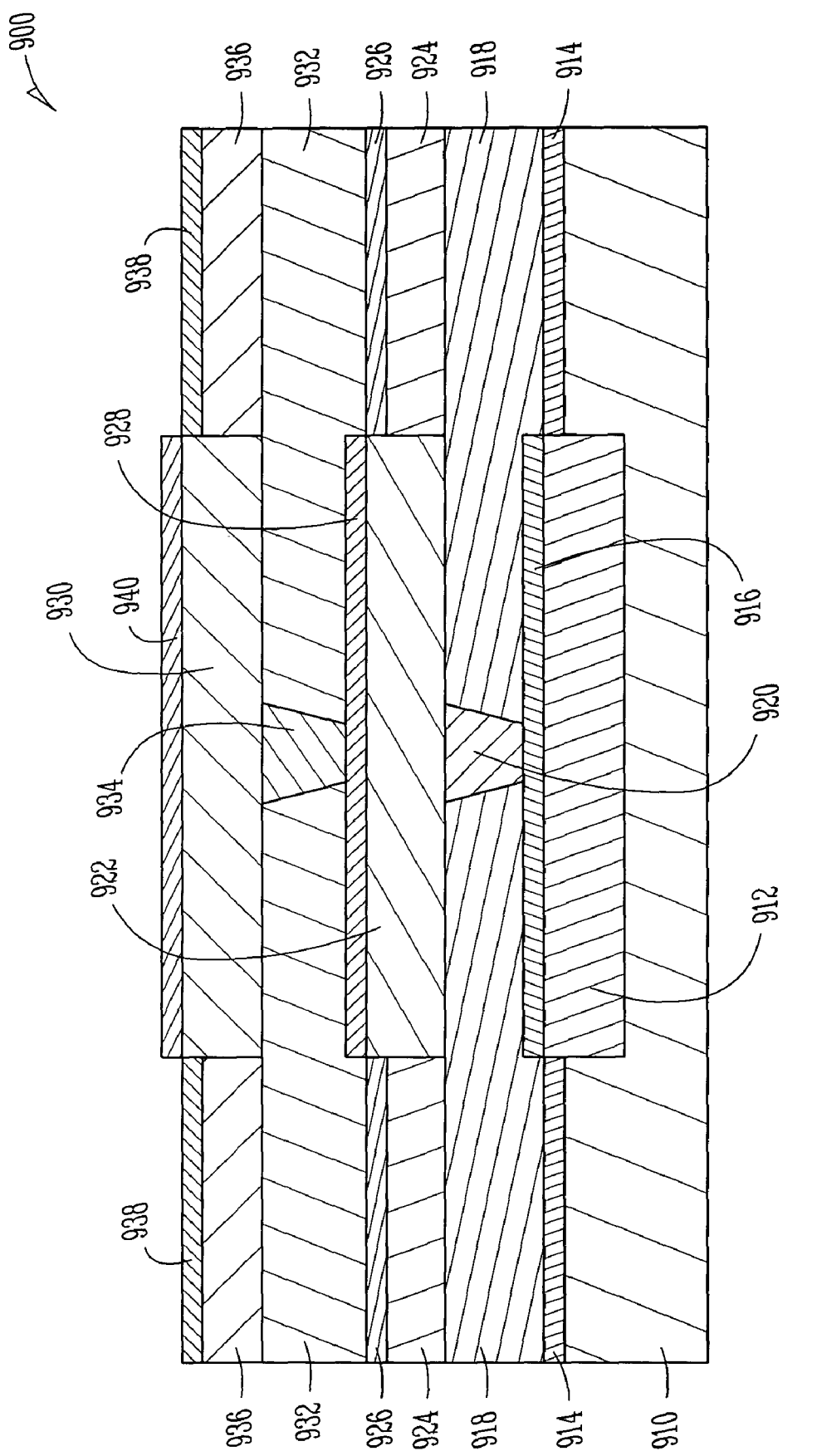
FIG. 9 is an cross-section drawing according to an embodiment

FIG. 9 is a cross-section of a semiconductor structure 900 according to an embodiment. The semiconductor structure 900 is fabricated without the use of etch stop layers according to an exemplary embodiment. The substrate 910 is an organic ILD material such as SiLK® made by Dow Chemical of Midland, Mich. A first metallization 912 is disposed in substrate 910. A first hard mask 914, made of a nitride material as set forth herein is disposed above substrate 910. First hard mask 914 makes an opening that defines a characteristic dimension (the left-to-right width) of first metallization 912. Disposed above first metallization 912 is a first conductive diffusion barrier layer 916 that is made of cobalt-phosphorus according to an electroless plating embodiment.

A first lower ILD layer 918 made of SiLK® is disposed over first metallization 912 and first hard mask 914. In a recess, a first interconnect 920 makes an electrical connection between first metallization 912 and a second metallization 922. Second metallization 922 is disposed in a first upper ILD layer 924 made of SiLK®. A second hard mask 926, made of a nitride material is disposed over first upper ILD layer 924, and has an opening that defines a characteristic dimension of second metallization 922. Disposed above second metallization 922 is a second conductive diffusion barrier layer 928 that is made of cobalt-phosphorus according to an electroless plating embodiment.

In the drawing depicted in FIG. 9, an upper or third metallization 930 is also formed. A second lower ILD layer 932 made of SiLK® is disposed over second conductive diffusion barrier layer 928 and second hard mask 926. Second lower ILD layer 932 defines a recess that is filled with a second interconnect 934. Second interconnect 934 makes an electrical connection between second metallization 922 and the third or upper metallization 930 through the shunt layer that is second conductive diffusion barrier layer 928. Third metallization 930 is disposed in a second upper ILD layer 936 made of SiLK®. A third or upper hard mask 938, made of a nitride material is disposed over second upper ILD layer 936, and has an opening that defines a characteristic dimension of third metallization 930. A third conductive diffusion barrier layer 940 is disposed above and on third metallization 930. By this embodiment, the processing is carried out with no etch stop layers such as those depicted in the embodiment illustrated in FIG. 8.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a metallization comprising:
   forming a first interlayer dielectric (ILD) layer above a substrate;
   forming a first recess in the first ILD layer;
   filling the first recess with a first interconnect;
   forming a conductive first diffusion barrier layer above and on the first interconnect;
   forming an upper ILD layer above the first conductive diffusion barrier layer;
   forming an upper recess in the upper ILD layer to expose the first conductive diffusion barrier layer;
   forming an upper interconnect in the upper recess; and
   forming a conductive upper diffusion barrier layer above and on the upper interconnect.

2. A process of forming a metallization comprising:
   forming a first interlayer dielectric (ILD) layer above a substrate;
   forming a first recess in the first ILD layer;
   filling the first recess with a first interconnect;
   forming a conductive first diffusion barrier layer above and on the first interconnect;
   forming an upper ILD layer above the first conductive diffusion barrier layer;
   forming an upper recess in the upper ILD layer to expose the first conductive diffusion barrier layer;
   forming an upper interconnect in the upper recess; and
   forming a conductive upper diffusion barrier layer above and on the upper interconnect, wherein at least one of forming a conductive first diffusion barrier layer and forming a conductive upper diffusion barrier layer includes:
   electroless plating the conductive diffusion barrier layer.

3. The process according to claim 1, wherein at least one of forming a conductive first diffusion barrier layer and forming a conductive upper diffusion barrier layer includes:
   vapor depositing the conductive diffusion barrier layer, selected from chemical vapor deposition, plasma-enhanced chemical vapor deposition, atomic layer chemical vapor deposition, and physical vapor deposition.

4. The process according to claim 1, further including:
   forming a barrier film in at least one of the first recess and the upper recess; and
   forming a conductive seed film over the barrier film.

5. The process according to claim 1, further including:
   forming a barrier film in at least one of the first recess and the upper recess;
   forming a conductive diffusion barrier film over at least one of the barrier films; and
   forming a conductive seed film over the conductive diffusion barrier film.

6. The process according to claim 1, wherein forming a first ILD layer includes forming an organic ILD layer, further including:

forming a hard mask above and on the organic ILD layer; and patterning an opening in the hard mask.

7. The process according to claim 1, further including:

forming a first hard mask above and on the first ILD layer;

patterning an opening in the first hard mask;

forming an upper hard mask above and on the upper ILD layer;

patterning an opening in the upper hard mask.

8. The process according to claim 1, wherein forming a first ILD layer includes:

forming an inorganic first bottom ILD layer; and forming an organic first top ILD layer.

9. The process according to claim 8, wherein forming a first recess includes:

forming a dual-damascene recess in the inorganic first bottom ILD layer and in the organic first top ILD layer.

10. The process according to claim 9, further including:

forming a first hard mask above and on the organic first top ILD layer; and patterning an opening in the first hard mask.

11. A process of forming a metallization comprising:

forming a first interlayer dielectric (ILD) layer above a substrate;

forming a first recess in the first ILD layer;

filling the first recess with a first interconnect;

forming a conductive first diffusion barrier layer above and on the first interconnect;

forming an upper ILD layer above the first conductive diffusion barrier layer;

forming an upper recess in the upper ILD layer to optionally expose the first conductive diffusion barrier layer;

forming an upper interconnect in the upper recess; and forming a conductive upper diffusion barrier layer above and on the upper interconnect, wherein forming an upper ILD layer includes:

forming an inorganic upper bottom ILD layer; and forming an organic upper top ILD layer, and wherein forming an upper recess includes forming a dual-damascene recess in the inorganic upper bottom ILD layer and in the organic upper top ILD layer, wherein forming a first ILD layer includes:

forming an inorganic first bottom ILD layer; and forming an organic first top ILD layer.

12. The process according to claim 11, further including:

forming an upper hard mask above and on the upper bottom ILD layer; and patterning an opening in the upper hard mask.

13. The process according to claim 1, wherein forming a first ILD layer includes:

forming an organic first bottom ILD layer; and forming an inorganic first top ILD layer.

14. The process according to claim 13, wherein forming a first recess includes:

forming a dual-damascene recess in the organic first bottom ILD layer and in the inorganic first top ILD layer.

15. The process according to claim 14, further including:

forming a first hard mask above and on the organic first bottom ILD layer; and patterning an opening in the first hard mask.

16. The process according to claim 13, wherein forming an upper ILD layer includes:

forming an organic upper bottom ILD layer; and forming an inorganic upper top ILD layer, and wherein forming an upper recess includes forming a dual-damascene recess in the organic upper bottom ILD layer and in the inorganic upper top ILD layer.

17. The process according to claim 16, further including:

forming an upper hard mask above and on the upper bottom ILD layer; and patterning an opening in the upper hard mask.

* * * * *